United States Patent [19]
Minami

[11] 3,942,159
[45] Mar. 2, 1976

[54] OPTICAL READOUT DEVICE
[75] Inventor: Masana Minami, Tokyo, Japan
[73] Assignee: Tokyo Shibaura Electric Co., Ltd., Kawasaki, Japan
[22] Filed: Dec. 20, 1973
[21] Appl. No.: 426,598

[30] Foreign Application Priority Data
Dec. 21, 1972 Japan.............................. 47-127716

[52] U.S. Cl........ 340/173 LM; 340/324 R; 350/161
[51] Int. Cl.².......................................... G11C 11/42
[58] Field of Search................. 340/324 R, 173 LM; 350/161

[56] References Cited
UNITED STATES PATENTS
3,145,368  8/1964  Hoover .......................... 340/173 PL
3,559,190  1/1971  Bitzer............................ 340/173 PL
3,765,749  10/1973  LaMacchia .................. 340/173 LM Primary Examiner—Terrell W. Fears
Attorney, Agent, or Firm—Oblon, Fisher, Spivak, McClelland & Maier

[57] ABSTRACT

An optical readout device including a gas discharge display panel with spot light sources each selectively energizable to illuminate the corresponding character pattern, a memory plate which stores the character patterns, and also including an image pickup device which detects the light distribution of the character pattern illuminated with the spot light of the said gas discharge display panel.

1 Claim, 6 Drawing Figures

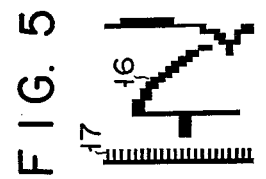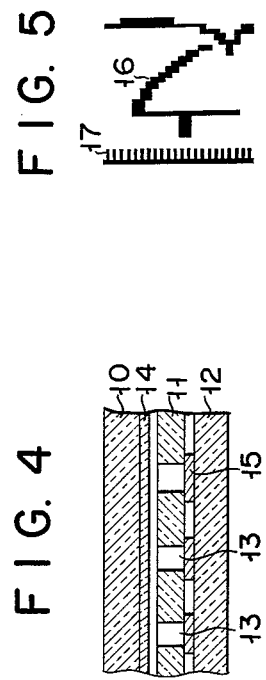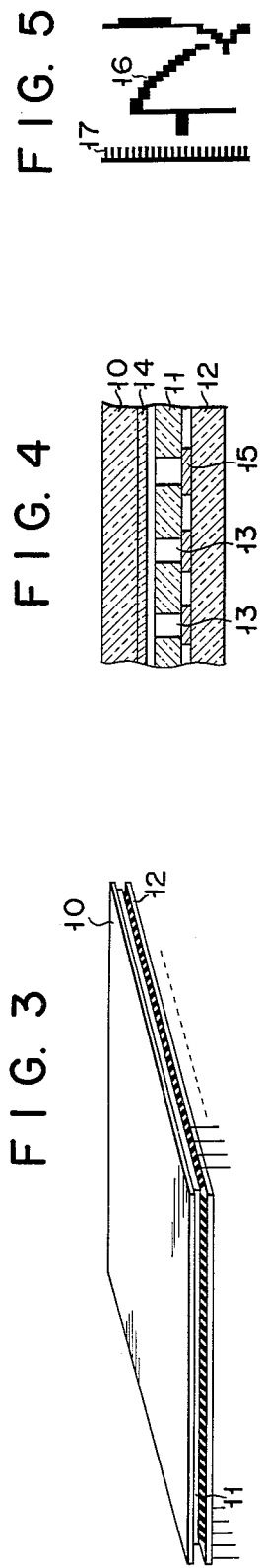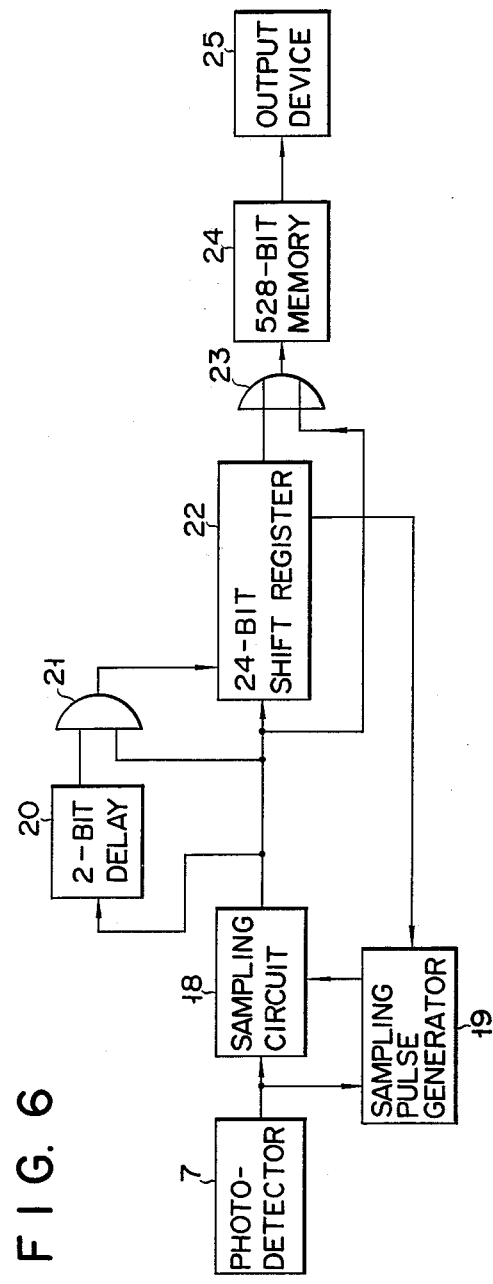

OPTICAL READOUT DEVICE

BACKGROUND OF THE INVENTION

This invention relates to an optical readout device and more particularly to an optical readout device of, for example, Chinese characters adapted to read out desired information from a memory plate stored with a large amount of information.

Readout of desired data, Chinese characters, for example, from a memory means storing a large amount of information, demands a prominently high degree of resolution. Therefore, the prior art readout device of such type had the drawback that the device as a whole was of complicated arrangement and consequently very expensive.

SUMMARY OF THE INVENTION

It is accordingly the object of this invention to provide an optical readout device attaining high resolution and admitting of miniaturization due to a simple arrangement.

The readout device of this invention using a gas discharge display panel as a source of light carries out high resolution and is well adapted to read out desired data, for example, Chinese characters from a memory device stored with a large amount of information in a limited space.

BRIEF DESCRIPTION OF THE DRAWINGS

FIGS. 3 and 4 illustrate a gas discharge display panel wherein FIG. 3 is an oblique view of the same and FIG. 4 is a fractional sectional view thereof;

FIG. 5 presents a character pattern stored in a memory plate; and

FIG. 6 illustrates a character pattern treating circuit extending from a character-detecting means to an output terminal.

DESCRIPTION OF THE PREFERRED EMBODIMENT

Figure 1:
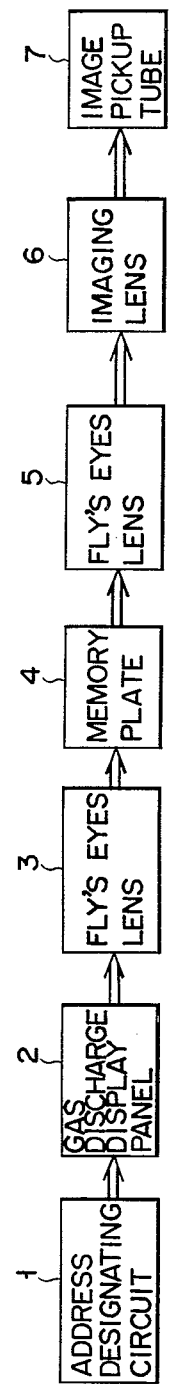
FIG. 1 is a block diagram showing the arrangement of the respective components of an optical Chinese character readout device according to this invention.
Figure 2:
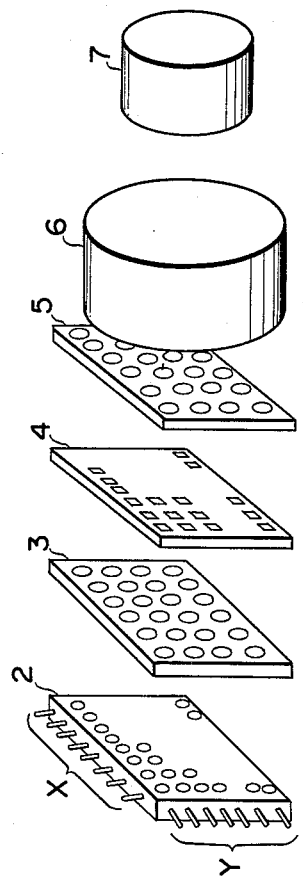
FIG. 2 is a schematic oblique view of said components.

There will now be described by reference to FIGS. 1 and 2 an optical Chinese character readout device according to this invention.

The address-designating output circuit 1 used in the readout device of this invention which consists of a type already well known to this particular field generates, upon receipt of a prescribed input signal, an output signal designating the address of data or a Chinese character being read out by means of a coordinate system bearing the X and Y axes. The output signal is transmitted to a gas discharge display panel 2 having numerous spot light sources arranged in the matrix form to illuminate selected one of said Chinese characters. Disposed near the gas discharge display panel 2 is a first fly's eyes lens 3 so as to face said display panel 2. The extremely minute unit lenses of the fly's eyes lens 3 are also arranged in the matrix form in the same number as the spot light sources of the spot display tube 2 so as to be aligned with said light sources. Accordingly, a light beam emitted from a given spot light source is focused through the corresponding minute unit lens. The focused light beam illuminates the corresponding optical information or Chinese character stored in a memory plate 4 positioned adjacent to the fly's eyes lens 3. The memory plate 4 has many different optical information arranged in the matrix form. Each optical image is made to correspond to the address designated by the X–Y coordinate system. A second fly's eyes lens 5 is of the same type as the first fly's eyes lens 3, and is located on the opposite side of the memory plate 4 to which faces the said first fly's eyes lens 3. As the result, a light beam carrying the optical image information, read out by projection is focused through the corresponding minute unit lens of the second fly's eyes lens 5 and transmitted to an imaging lens 6 located behind the second fly's eyes lens 5. After enlarged by the imaging lens 6, the aforesaid optical image light is transmitted to the light detecting surface of a photodetector 7, for example, an image pickup tube. The gas discharge display panel 2 may be the type shown in FIGS. 3 and 4. This type is an ordinary X–Y matrix type discharge panel utilizing negative glow discharge. The panel is formed of an upper glass plate 10, intermediate glass plate 11 and lower glass plate 12, all laminated together. The intermediate glass plate 11 is bored with 53 × 53 vertical cells 13 arranged in the matrix form. Neon gas is sealed in said cells. 53 strip-shaped nessar films 14 acting as anodes are spatially arranged parallel across that side of the upper glass plate 10 which faces the cells 13. And 53 strip-shaped tin oxide films 15 are spatially arranged parallel lengthwise of that side of the lower glass plate 12 which faces the cells 13. Accordingly, both groups of the strip-shaped electrode films 14, 15 intersect each other at the cells 13. The cells 13 each 0.3 mm in diameter are arranged with a pitch of 1.092 mm. A gas discharge display panel of the above-mentioned construction provides a light quantity of $2 \times 10^4$ fL, where a stabilization resistance is set at 200 KV and discharge current at 0.9 mA.

Where the aforesaid gas discharge display panel 2 is used, the selected switches on the X and Y-axes are actuated upon receipt of an address designating signal as in the ordinary X–Y address selecting circuit to impress voltage across the anode and cathode corresponding to the desired address, thereby giving forth an electric discharge at the cell corresponding to the junction of both electrodes. The time required for the discharge to be started after the supply of said address designating input signal is about 10 microseconds.

The memory plate 4 is stored with numerous 0.2 mm square character patterns like those indicated by the numeral 16 of FIG. 5 which are arranged parallel with a pitch of 1.092 mm. The characters are impressed on a photographic film or dry plate using a silver salt sensitizer. The characters are presented in the form of mosaic patterns representing 22 × 24 bits in all so as to facilitate the subsequent treatment by logical codes or electric signals. A comb-shaped pattern 17, is provided opposite to each mosaic character pattern for correction of minute positional changes in the characters.

The fly's eyes lenses 3, 5 may consist of a commercially available MRP-110 type made of acrylic resin manufactured by Frathom Company, for example, of the United States. This fly's eyes lens is formed of 53 × 53 unit lenses arranged with a pitch of 1.092 mm. The unit lens is the so-called convex flat lens whose focal length is 3.2 mm and whose curvature is 1.58 mm. Though such fly's eyes lens may be used intact, it is preferred to cover the fly's eyes lens with a mask bored with pin holes 0.8 mm in diameter so formed as to face the respective unit lenses in order to attain the distinct optical separation of the adjacent unit lenses from each other and also to elevate the resolution of the optical system of the subject readout device.

The imaging lens 6 may consist of a type having a diameter 80 mm and a focal length of 100 mm. The ratio of the focal length of the focal lens 6 to that of the unit lenses of the fly's eyes lense 5 determines the rate at which the original image is magnified. According to the foregoing embodiment of this invention, the rate of magnification is set at 30 times.

The camera or photo-detector 7 may consist of an image pickup tube manufactured by Tokyo Shibaura Electric Co., Ltd. under the commercial name of Chalnicon E5063 in consideration of the amount and spectrum of light emitted from the gas discharge display panel 2.

A character pattern received by the photo-detector 7 may, if necessary, be recorded at the output end with a printer by a process already well known to this particular field. If, in this case, there is used a character pattern treating circuit shown in FIG. 6 and described hereinafter, then it will be possible to suppress any harmful effect of scars or dust which happen to appear on the memory plate 4.

There will now be described by reference to FIG. 6 the character pattern treating circuit. The output terminal of the photo-detector 7 is connected to a sampling circuit 18 and also to a sampling pulse generator 19, whose output terminal is connected to the input terminal of the sampling circuit 18. The output terminal of the sampling circuit 18 is connected to one input terminal of an AND circuit 21 through a 2-bit delay circuit 20 and also directly to the other input terminal thereof. The output terminal of the sampling circuit 18 is connected to one input terminal of a 24-bit shaft register 22. The output terminal of the AND circuit 21 is connected to the input terminal of a 24-bit shift register 22 which is supplied with a trigger pulse for commencing shifting in said register 22. The output terminal of the 24-bit shift register 22 is connected to one input terminal of an OR circuit 23, the other input terminal of which is connected to the input terminal of the sampling circuit 18. The output terminal of the OR circuit 23 is connected to end means, for example, a printer 25 through a 528-bit shift register 24. The 24-bit shift register 22 delivers, when required, a reset signal to the sampling pulse generator 19.

There will now be described the operation of the character pattern treating circuit of FIG. 6 by reference to the case where the character pattern of FIG. 5 is to be displayed. The character pattern consists of 22 bits in the indicated vertical direction and 24 bits in the indicated horizontal direction. The comb-shaped pattern 17 is formed of 22 bits in the vertical direction and 3 bits in the horizontal direction. Of said three bits, one bit represents the width of the vertical rod of the comb-shaped pattern 17. The respective teeth have a length corresponding to two bits and a width corresponding to one bit. The end of the teeth is spaced one bit from the character pattern. Data indicating the character pattern of FIG. 6 is horizontally scanned by the beam in the image pickup tube 7, said scanning being carried out by two scanning lines per one-bit width of each tooth. The output of scanning is subjected to sampling at a time interval corresponding to one bit. The timing in which the sampling is commenced is triggered by the vertical rod of the comb-shaped pattern 17. Upon receipt of a trigger signal, the sampling pulse generator 19 supplies a sampling pulse to the sampling circuit 18. When scanning is carried up to the end of the respective teeth, namely, three bits are counted, then the sampling circuit 18 is opened to cause the 24-bit shift register 22 to be temporarily stored with bit signals representing the character pattern of FIG. 5 in succession. These bit signals are supplied to the AND circuit 21 directly as well as through the 2-bit delay circuit 20. An output signal from the AND circuit 21 causes the 24-bit shift register 22 to start shifting. An output signal from said shift register 22 is transmitted to the 528-bit memory 24 through the OR circuit 23. The 528-bit memory 24 is supplied with an output signal from the sampling circuit 18 through the OR circuit 23. The latter output signal from the sampling circuit 18 is delayed 24 bits from the former output signal from the shift register 22, namely, represents a second scanning signal applied to the same tooth of the comb-shaped pattern 17. This arrangement is intended to suppress any harmful effect of scars or dust which happen to appear on the surface of the image pickup tube and/or the memory plate 4. Thus the bit signals stored in the 528-bit memory 24 are delivered to the output terminal 25 of the subject readout device for actual display.

Where, as mentioned above, the comb-shaped pattern 17 is provided for each character pattern, then the vertical displacement of the character pattern is suppressed by the vertical rod of said comb-shaped pattern 17 and the horizontal displacement of the character pattern by the teeth of said comb-shaped pattern 17.

In the foregoing embodiment, a first fly's eyes lens 3 was used to focus a light beam emitted from the gas discharge display panel 2. However, said lens 3 is not always necessary. Instead, it is possible to cover the light-emitting surface of the gas discharge display panel 2 with a mask having pin holes arranged in the matrix form so as to face the minute light sources of said gas discharge display panel 2. Further, the light-emitting surface of the gas discharge display panel 2 may be covered with a ground glass plate so as to attain the uniform emission of light from said panel 2.

What is claimed is:

1. An optical readout device comprising:
   a gas discharge display panel provided with a plurality of spot light sources selectively energized to emit light,
   a memory plate having a plurality of items of information stored in alignment with said spot light sources,
   address designating means to selectively cause the spot light sources to emit light to illuminate the corresponding items of information,
   a fly's eyes lens having a plurality of extremely minute unit lenses arranged in alignment with the items of information stored in the memory plate and focussing a beam of light denoting an item of information selectively read out from the memory plate,
   an image lens for imaging a beam of light passing through any fly's eyes lens,
   a character pattern treating circuit for receiving light beams denoting the items of information read out from the image lens to suppress any harmful effect of scars or dust appearing on the memory plate comprising a photodetector for receiving light beams denoting the items of information read out from the image lens,
a sampling pulse generator,
a sampling circuit,
delay means,
an AND gate,
a shift register,
an OR gate,
memory means,
a printer,
means connecting the output of the photodetector to a first input of the sampling circuit and to a first input of the sampling pulse generator,
means connecting the output of the sampling pulse generator to a second input of the sampling circuit,
means connecting the output of the sampling circuit to the input of the delay means, to a second input of the AND gate, to a second input of the shift register, and to a second input of the OR gate,
means connecting the output of the delay means to a first input of the AND gate,
means connecting the output of the AND gate to a first input of the shift register,
means connecting a first output of the shift register to a second input of the sampling pulse generator and means connecting a second output of the shift register to a first input of the OR gate,
means connecting the output of the OR gate to the input of the memory means,
means connecting the output of the memory means to the input of the printer.

\* \* \* \* \*